(12) United States Patent
Kimoto et al.

(10) Patent No.: US 11,306,847 B2
(45) Date of Patent: Apr. 19, 2022

(54) VALVE DEVICE, PROCESSING APPARATUS, AND CONTROL METHOD

(71) Applicant: TOKYO ELECTRON LIMITED, Tokyo (JP)

(72) Inventors: Tomohisa Kimoto, Niraski (JP); Yuichi Furuya, Niraski (JP); Takashi Kakegawa, Niraski (JP); Eiichi Komori, Niraski (JP); Hideaki Fujita, Niraski (JP); Hiroyuki Mori, Niraski (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 83 days.

(21) Appl. No.: 16/538,228

(22) Filed: Aug. 12, 2019

(65) Prior Publication Data

US 2020/0056724 A1 Feb. 20, 2020

(30) Foreign Application Priority Data

Aug. 17, 2018 (JP) .............................. JP2018-153715

(51) Int. Cl.
  *F16K 49/00* (2006.01)
  *H01L 21/67* (2006.01)
  (Continued)

(52) U.S. Cl.
  CPC .......... *F16K 49/00* (2013.01); *C23C 16/4405* (2013.01); *C23C 16/45561* (2013.01);
  (Continued)

(58) Field of Classification Search
  CPC ...... F16K 49/00; F16K 49/002; F16K 49/005; F16K 27/0263; F16K 31/002;
  (Continued)

(56) References Cited

U.S. PATENT DOCUMENTS

2002/0066535 A1 6/2002 Brown et al.
2008/0223455 A1* 9/2008 Fukuhara .......... C23C 16/45557
                                                         137/488

(Continued)

FOREIGN PATENT DOCUMENTS

| CN | 106661730 A | 5/2017 |
| JP | 2016-23324 A | 2/2016 |
| WO | 2018/046650 A1 | 3/2018 |

*Primary Examiner* — Jeffrie R Lund
(74) *Attorney, Agent, or Firm* — Nath, Goldberg & Meyer; Jerald L. Meyer; Tanya E. Harkins

(57) ABSTRACT

A valve device includes: valves configured to control a flow of processing gases supplied to a process vessel; a housing in which first flow paths through which the processing gases flow are formed; a heat diffuser configured to cover the housing and diffuse heat of the housing; a heating part configured to cover the housing covered with the heat diffuser and heat the housing via the heat diffuser; a supply configured to supply a coolant to a second flow path formed between the housing and the heat diffuser; and a controller configure to control the heating part to heat the housing to a first temperature when a predetermined process is performed on a target substrate, and before a start of a cleaning process of the process vessel, control the heating part to stop heating of the housing and control the supply to supply the coolant to the second flow path.

9 Claims, 8 Drawing Sheets

(51) Int. Cl.
*C23C 16/44* (2006.01)
*C23C 16/455* (2006.01)

(52) U.S. Cl.
CPC .......... *F16K 49/002* (2013.01); *F16K 49/005* (2013.01); *H01L 21/67017* (2013.01); *H01L 21/67109* (2013.01); *H01L 21/67248* (2013.01)

(58) Field of Classification Search
CPC .......... C23C 16/45561; C23C 16/4405; C23C 16/45585; H01L 21/67109; H01L 21/67248; H01L 21/67017; H01L 21/67098
See application file for complete search history.

(56) References Cited

U.S. PATENT DOCUMENTS

| | | | |
|---|---|---|---|
| 2019/0106787 A1* | 4/2019 | Ohno | ................ C23C 16/45561 |
| 2020/0056724 A1* | 2/2020 | Kimoto | ............. H01L 21/67109 |
| 2020/0283899 A1* | 9/2020 | Inagaki | ............... C23C 16/4405 |

* cited by examiner

VALVE DEVICE, PROCESSING APPARATUS, AND CONTROL METHOD

CROSS-REFERENCE TO RELATED APPLICATION

This application is based upon and claims the benefit of priority from Japanese Patent Application No. 2018-153715, filed on Aug. 17, 2018, the entire contents of which are incorporated herein by reference.

TECHNICAL FIELD

The present disclosure relates to a valve device, a processing apparatus, and a control method.

BACKGROUND

As a method of forming a film on a semiconductor wafer (hereinafter, referred to as a wafer), there is a chemical vapor deposition (CVD) method, an atomic layer deposition (ALD) method, and the like. In the CVD method or the ALD method, a source gas is used for depositing a film. However, there is a case where a source is in a solid or liquid state at room temperature. Such a source is heated and gasified before being supplied to the wafer. In this case, pipes, valves, and the like forming a supply path of the gasified source are also heated to a desired temperature in order to maintain the source in a gaseous state.

There is also a case where a reaction byproduct (so-called deposition) generated when a wafer is processed in a process vessel adheres to an inner wall or the like of the process vessel. When the amount of deposition adhering to the inner wall or the like of the process vessel is increased, the deposition is peeled off from the inner wall or the like of the process vessel and scattered as particles in the process vessel. When the particles scattered in the process vessel adhere to the wafer, it may cause a defect of the wafer. Therefore, a cleaning process is periodically performed to remove the deposition in the process vessel. For the cleaning process, a fluorine-containing gas is often used as a cleaning gas.

In many cases, a plurality of gases is used for processing the wafer, and devices such as valves or the like are installed to control supply amounts of the respective gases. The valves are often configured as a valve device as a single unit for miniaturization or the like. When the gas supply path is heated to maintain the gaseous state of the source, the entirety of the valve device is heated by a heater or the like.

PRIOR ART DOCUMENTS

Patent Documents

Patent Document 1: Japanese laid-open publication No. 2016-23324

SUMMARY

An aspect of the present disclosure provides a valve device including: a plurality of valves configured to control a flow of a plurality of processing gases supplied to a process vessel; a housing in which a plurality of first flow paths through which the processing gases flow is formed; a heat diffuser configured to cover the housing and diffuse heat of the housing; a heating part configured to cover the housing covered with the heat diffuser and heat the housing via the heat diffuser; a supply configured to supply a coolant to a second flow path formed between the housing and the heat diffuser; and a controller. The controller configured to: control the heating part so as to heat the housing to a first temperature when a predetermined process is performed on a target substrate in the process vessel; and before a start of a cleaning process of the process vessel, control the heating part to stop heating of the housing and control the supply so as to supply the coolant to the second flow path.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a valve device, a processing apparatus, and a control method according to the present disclosure will now be described in detail with reference to the drawings. The valve device, the processing apparatus, and the control method according to the present disclosure are not limited by the following embodiment.

Stainless steel is often used as members such as valves or the like forming a gas supply path in terms of corrosion resistance, ease of processing, and the like. The stainless steel is corroded when it is exposed to a fluorine-containing gas at high temperature. Therefore, in an apparatus in which the gas supply path is heated to maintain a gaseous state of a source, it is necessary to cool a temperature of pipes, valves, or the like to a temperature before a cleaning process so as not to be corroded by a cleaning gas.

However, a valve device in which a plurality of valves is configured as a single unit has a high heat capacity because a volume of a metal member constituting the valve device is large. Therefore, it takes time to cool the valve device heated by a heater to a temperature at Which the valve device is not corroded by the cleaning gas. Accordingly, it takes time to start the cleaning process, prolonging a down time of the processing apparatus.

Therefore, the present disclosure provides a technique capable of reducing a down time of the processing apparatus caused by the cleaning process.

[Configuration of Processing Apparatus]

Figure 1:
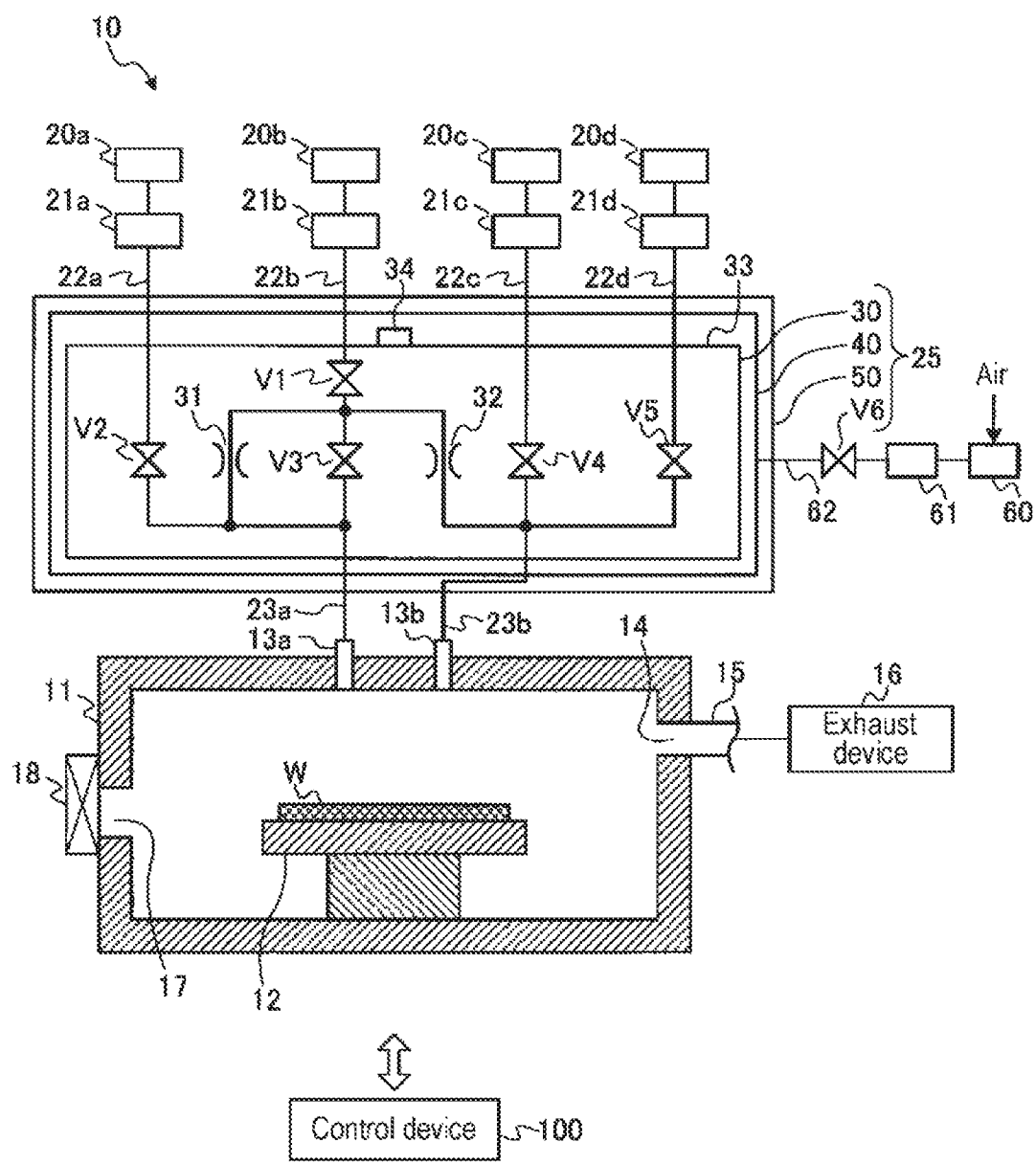
FIG. 1 is a schematic view illustrating an example of a processing apparatus according to an embodiment of the present disclosure.

FIG. 1 is a schematic view illustrating an example of a processing apparatus 10 according to an embodiment of the present disclosure. The processing apparatus 10 according to the present embodiment is an apparatus that forms a predetermined film (for example, a tungsten film) on a wafer W, which is an example of a substrate to be processed, using an ALD method. The processing apparatus 10 is installed in, for example, a clean room.

The processing apparatus 10 may include a process vessel 11, as illustrated in FIG. 1. A stage 12 on which a wafer W as a target of film formation is mounted is installed in the process vessel 11. An opening 17 for loading and unloading the wafer W is formed on a sidewall of the process vessel 11, and is opened and closed by a gate valve 18. In addition, a supply pipe 13a and a supply pipe 13b for supplying gases into the process vessel 11 are installed in an upper portion of the process vessel 11. Furthermore, an exhaust port 14 is formed on the sidewall of the process vessel 11, and an exhaust device 16 is connected to the exhaust port 14 via an exhaust pipe 15. Gases in the process vessel 11 are exhausted by the exhaust device 16 so that the interior of the process vessel 11 is maintained at a desired degree of vacuum.

The processing apparatus 10 further dudes a gas supply 20a, a gas supply 20b, a gas supply 20c, and a gas supply 20d. The gas supply 20a is a source of a precursor gas. In the present embodiment, the precursor gas may be a tungsten hexachloride ($WCl_6$) gas. The $WCl_6$ gas from the gas supply 20a is supplied to a valve device 25 via a flow rate controller 21a such as a mass flow controller (MFC), and a pipe 22a.

Since $WCl_6$ is in a solid state at room temperature, the gas supply 20a heats $WCl_6$ to 200 degrees C. or higher (e.g., 200 degrees C.) and supplies gasified $WCl_6$ to the flow rate controller 21a. The flow rate controller 21a and the pipe 22a are also heated to 200 degrees C. or higher (e.g., 200 degrees C.) by a heating mechanism (not shown) in order to maintain $WCl_6$ in a gaseous state.

The gas supply 20b is a source of an inert gas. In the present embodiment, the inert gas may be a nitrogen ($N_2$) gas. The $N_2$ gas from the gas supply 20b is supplied to the valve device 25 via a flow rate controller 21b and a pipe 22b.

The gas supply 20c is a source of a reaction gas. In the present embodiment, the reaction gas is, for example, a hydrogen ($H_2$) gas. The $H_2$ gas from the gas supply 20c is supplied to the valve device 25 via a flow rate controller 21c and a pipe 22c. The precursor gas, the inert gas, and the reaction gas are examples of a processing gas.

The gas supply 20d is a source of a cleaning gas for removing a deposition adhering to the interior of the process vessel 11. In the present embodiment, the cleaning gas may be a fluorine-containing gas, such as a chlorine trifluoride ($ClF_3$) gas. The $ClF_3$ gas from the gas supply 20d is supplied to the valve device 25 via a flow rate controller 21d and a pipe 22d. The cleaning gas may also be a hydrogen fluoride (HF) gas or the like as long as the cleaning gas is a fluorine-containing gas.

The processing apparatus 10 has the valve device 25. The valve device 25 has a valve main body 30, a heat diffusion jacket 40, a heating jacket 50, and a valve V6. The valve main body 30 has valves V1 to V5, orifices 31 and 32, a housing 33, and a temperature sensor 34. Each of the valves V1 to V5 has a valve body installed in a gas flow path and an actuator for driving the valve body.

An upstream side of the valve V1 is connected to the pipe 22b and a downstream side of the valve V1 is connected to upstream sides of the valve V3, the orifice 31, and the orifice 32. Downstream sides of the valve V3 and the orifice 31 are connected to a pipe 23a. The pipe 23a is connected to the supply pipe 13a. A downstream side of the orifice 32 is connected to a pipe 23b which is connected to the supply pipe 13b.

An upstream side of the valve V2 is connected to the pipe 22a and a downstream side of the valve V2 is connected to the pipe 23a. An upstream side of the valve V4 is connected to the pipe 22c and a downstream side of the valve V4 is connected to the pipe 23b. An upstream side of the valve V5 is connected to the pipe 22d and a downstream side of the valve V5 is connected to the pipe 23b.

A gas flow path in the valve main body 30 is formed in the housing 33 made of metal. In the present embodiment, the housing 33 may be a single body made of stainless steel (e.g., SUS316). Alternatively, the housing 33 may be configured by connecting a plurality of blocks in which the gas flow path is formed. The flow path in the housing 33 is an example of a first flow path.

The temperature sensor 34 may be installed on an outer surface of the housing 33, and measures a temperature of the housing 33. The temperature sensor 34 may be a thermocouple. Temperature information measured by the temperature sensor 34 is output to a control device 100 to be described later.

The valve main body 30 is covered with the heat diffusion jacket 40 may be made of aluminum or the like. The heat diffusion jacket 40 is an example of a heat diffuser. The valve main body 30 covered with the heat diffusion jacket 40 is further covered with the heating jacket 50 such as a mantle heater or the like. The heating jacket 50 is an example of a heating part. The heating jacket 50 includes a heat insulating member made of, for example, glass fiber or the like, and a heater embedded in the heat insulating member. The heating jacket 50 heats the valve main body 30 through the heat diffusion jacket 40. The heat diffusion jacket 40 diffuses heat transferred from the heating jacket 50 and transfers the heat to the valve main body 30. Thus, distribution of heat in the valve main body 30 is uniformalized. The heater in the heating jacket 50 is controlled by the control device 100 to be described later.

A flow path through which air at room temperature flows is formed between the housing 33 of the valve main body 30 and the heat diffusion jacket 40, and a pipe 62 is connected to the flow path. The valve V6, a flow rate controller 61, and a compressor 60 are connected to the pipe 62. The compressor 60 introduces the air at room temperature outside the processing apparatus 10 (i.e., inside the clean room) and compresses the introduced air. The flow rate controller 61 adjusts a flow rate of the air introduced by the compressor 60. The air adjusted in the flow rate is supplied to the flow path between the housing 33 and the heat diffusion jacket 40 via the valve V6 and the pipe 62. The air supplied between the housing 33 of the valve main body 30 and the heat diffusion jacket 40 is an example of a coolant. The valve V6 is an example of a supply part.

The processing apparatus 10 has the control device 100. The control device 100 includes a memory, a processor, and an input/output interface. A program executed by the processor, a recipe including conditions of each process, or the like is stored in the memory. The processor executes the program read from the memory, and controls each part of the processing apparatus 10 via the input/output interface based on the recipe stored in the memory. Specifically, the control device 100 controls the valves V1 to V6, the flow rate controllers 21a to 21d, the flow rate controller 61, the exhaust device 16, and the heater in the heating jacket 50, and the like by executing the program read from the memory. The control device 100 is an example of a controller.

[Structure of Valve Device 25]

Figure 2:
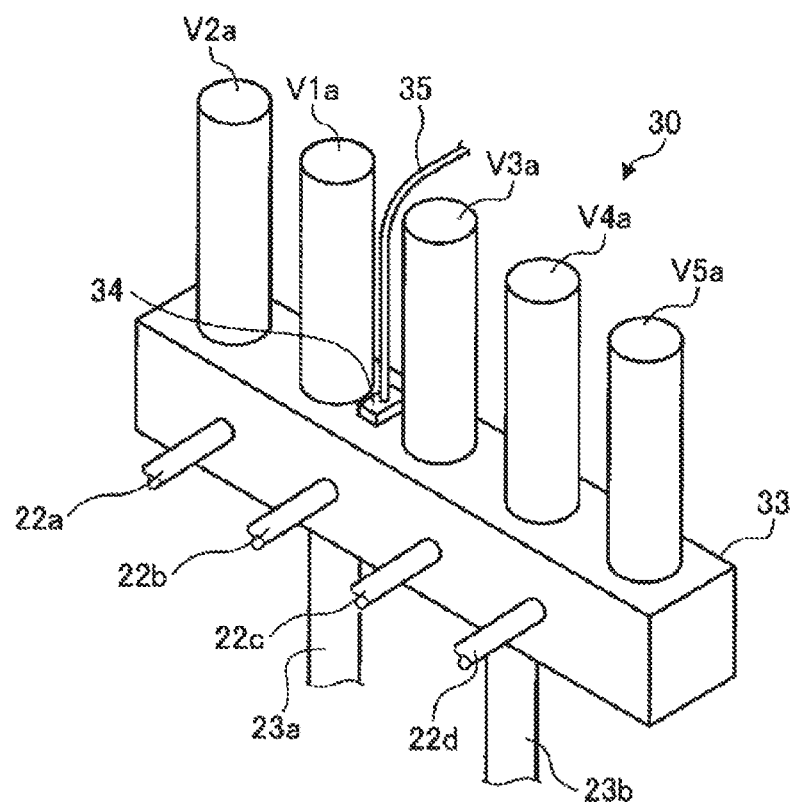
FIG. 2 is a perspective view illustrating an example of a valve main body.

FIG. 2 is a perspective view illustrating an example of the valve main body 30. For example, as illustrated in FIG. 2, the valve main body 30 has a substantially rectangular parallelepiped housing 33. The pipes 22a to 22d are installed on a side surface of the housing 33, and the pipes 23a and 23b are installed on a bottom surface of the housing 33. Each of an actuator V1a of the valve V1, an actuator V2a of the valve V2, an actuator V3a of the valve V3, an actuator V4a of the valve V4, and an actuator V5a of the valve V5 protrudes outward from an upper surface of the housing 33. Further, the temperature sensor 34 is installed on the upper surface of the housing 33, and is connected to the control device 100 via a cable 35.

Figure 3:
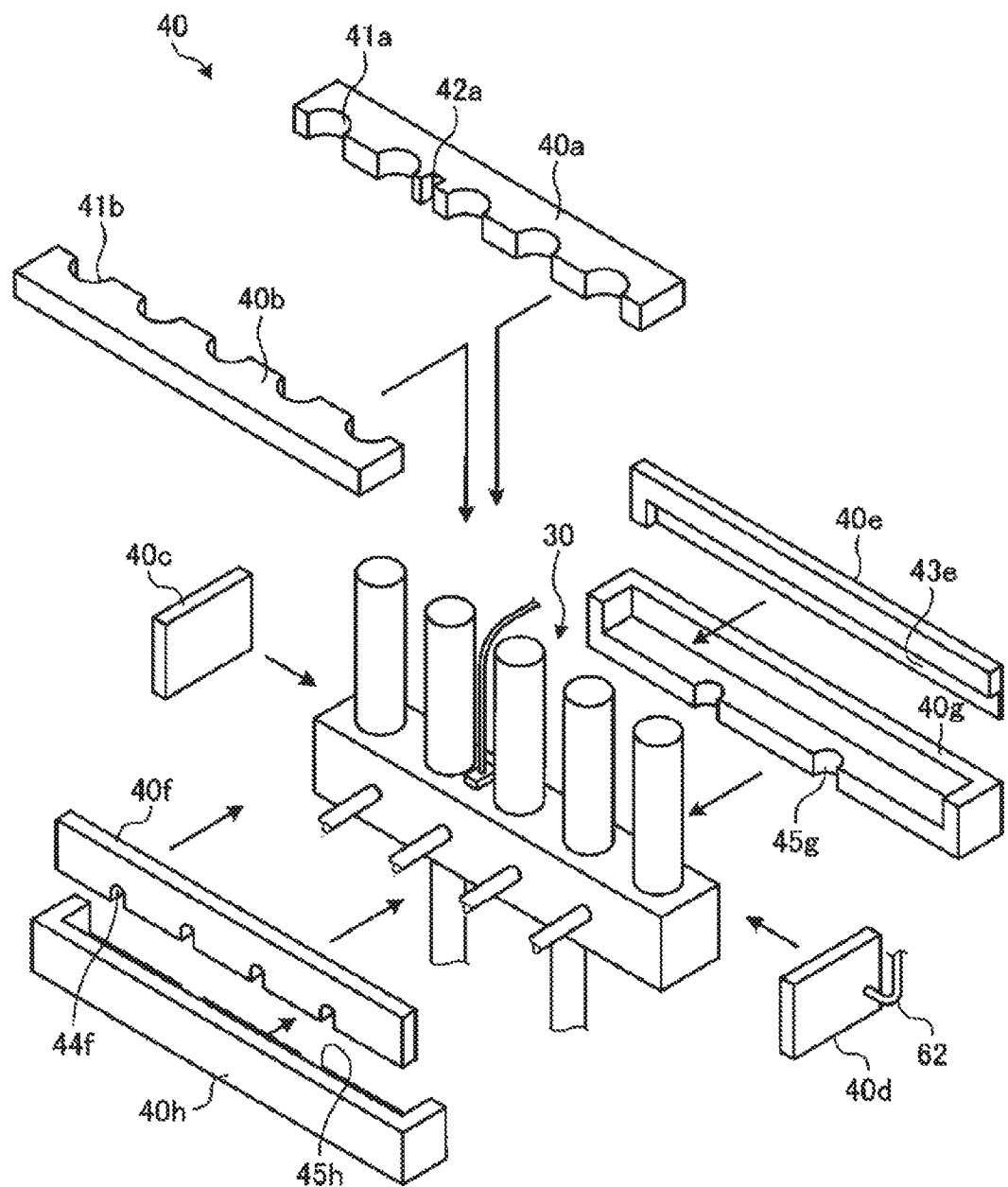
FIG. 3 is an exploded perspective view illustrating an example of a heat diffusion jacket installed in the valve main body.

FIG. 3 is an exploded perspective view illustrating an example of the heat diffusion jacket 40 installed in the valve main body 30. The heat diffusion jacket 40 includes a plurality of parts 40a to 40h. The parts 40a and 40b are arranged on the upper surface of the housing 33. The parts 40c to 40f are arranged on the side surface of the housing 33. The parts 40g to 40h are arranged on the bottom surface of the housing 33.

Recesses 41a along shapes of the actuators V1a to V5a of the respective valves, and a recess 42a in which the cable 35 connected to the temperature sensor 34 is arranged are formed in the part 40a. Recesses 41b along the shapes of the actuators V1a to V5a of the respective valves are formed in the part 40b. The pipe 62 is connected to the part 40d. A recess 43e extending in a longitudinal direction of the housing 33 is formed on a surface of the part 40e facing the housing 33. Recesses 44f in which the pipes 22a to 22d are arranged are formed in the part 40f. Recesses 45g along shapes of the pipes 23a and 23b are formed in the part 40g. Recesses 45h along the shapes of the pipes 23a and 23b are formed in the part 40h.

Figure 4:
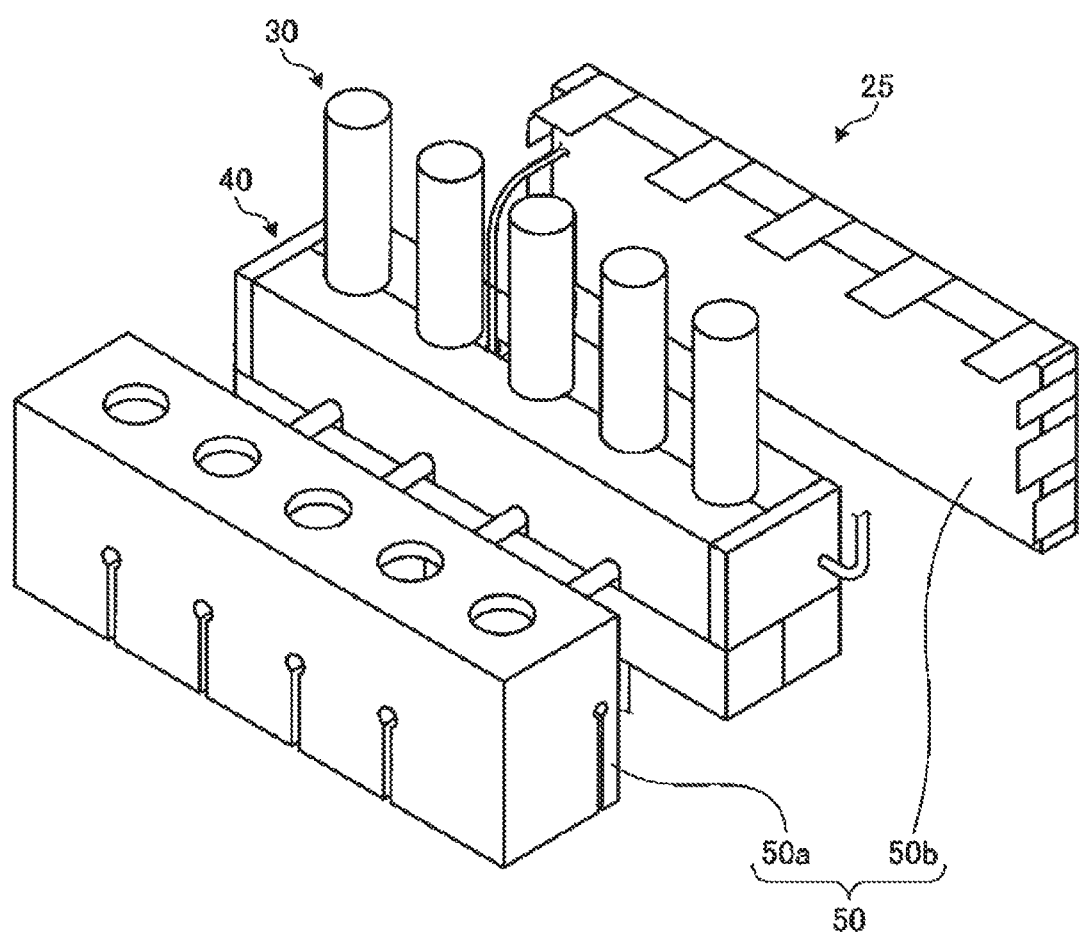
FIG. 4 is an exploded perspective view illustrating an example of a heating jacket installed in the valve main body in which the heat diffusion jacket is installed.

FIG. 4 is an exploded perspective view illustrating an example of the heating jacket 50 installed in the valve main body 30 in which the heat diffusion jacket 40 is installed. The healing jacket 50 has a part 50a and a part 50b. Each of the parts 50a and 50b is made of, for example, glass fiber, and has a built-in heater. The heater is connected to the control device 100 via a cable (not shown).

Figure 5:
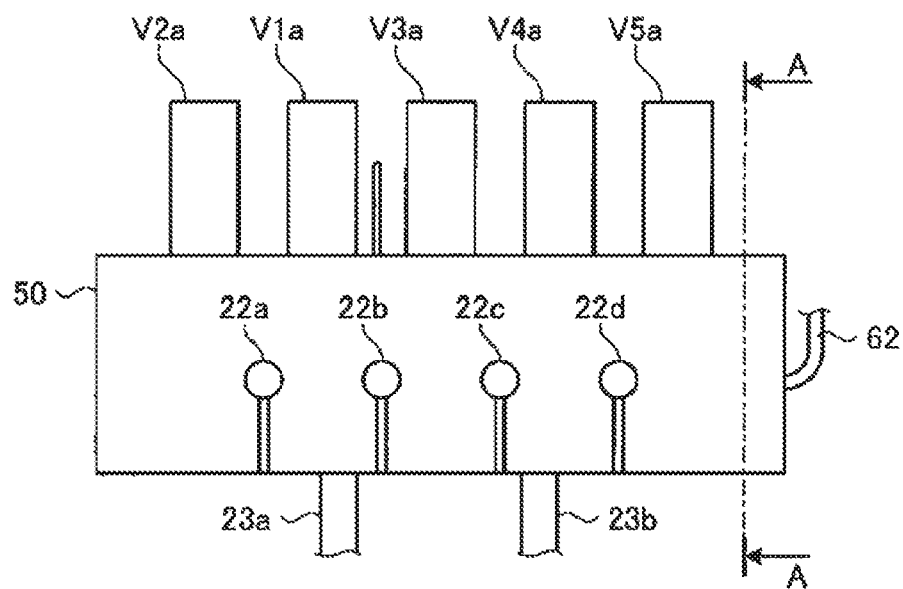
FIG. 5 is a side view illustrating an example of a valve device.
Figure 6:
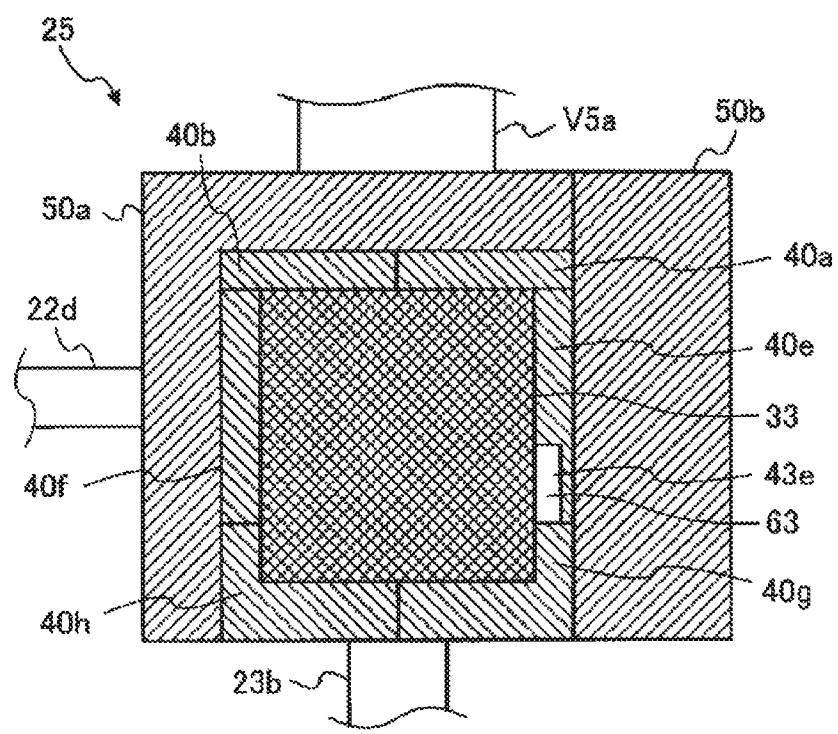
FIG. 6 is a sectional view taken along line A-A illustrating an example of the valve device.

FIG. 5 is a side view illustrating an example of the valve device 25. A section taken along line A-A in FIG. 5 is, for example, as illustrated in FIG. 6. FIG. 6 is a sectional view taken along line A-A illustrating an example of the valve device 25. For example, as illustrated in FIG. 6, the recess 43e is formed in the part 40e of the heat diffusion jacket 40, and an air flow path 63 is formed between the side surface of the housing 33 of the valve main body 30 and the recess 43e. The flow path 63 is in communication with the pipe 62 connected to the part 40d of the heat diffusion jacket 40. The air supplied to the flow path 63 via the pipe 62 flows through the flow path 63. The flow path 63 is an example of a second flow path.

In addition, due to dimensional tolerance or the like, gaps exist between the housing 33 and each of the parts 40a to 40h of the heat diffusion jacket 40 and between the parts 40a to 40h. Therefore, the air supplied to the flow path 63 flows out of the heat diffusion jacket 40 through these gaps. The air flowing out of the heat diffusion jacket 40 flows through the heat insulating member of the heating jacket 50 made of glass fiber or the like and flows out of the heating jacket 50.

In the present embodiment, the housing 33 of the valve main body 30 has a single body made of, for example, stainless steel (e.g., SUS316). Since a volume of the metal member constituting the housing 33 is larger than those of other members through which the gas flows (for example, metal pipes), heat capacity of the housing 33 is larger than those of other members. Therefore, the housing 33 is difficult to heat and cool. In addition, in order to suppress corrosion of the housing 33 made of stainless steel, the cleaning process using a fluorine-containing gas needs to be performed in such a state that the temperature of the housing 33 reaches a desired temperature (e.g., 90 degrees C.) or lower.

Due to an act of the heat insulating member of the heating jacket 50, it is difficult for the heat of the housing 33 and the heat diffusion jacket 40 to escape to the outside of the heating jacket 50. Therefore, for example, even if the temperature of the heater of the heating jacket 50 is set to the desired temperature or lower after a film forming process is performed, it may take several hours to cool the housing 33, which was heated to, e.g., 200 degrees C., during the film forming process, to the desired temperature or lower. Thus, a waiting time until the start of the cleaning process becomes long, prolonging a down time of the processing apparatus. Therefore, it is difficult to improve throughput of the whole process.

On the other hand, in the present embodiment, after the film forming process is performed, air is supplied to the flow path 63 via the pipe 62 in addition to setting the temperature of the heater of the heating jacket 50 to the desired temperature or lower. Thus, air existing between the housing 33 and each of the parts 40a to 40h of the heat diffusion jacket 40 and between the parts 40a to 40h is pushed out to the outside of the heating jacket 50 by the air supplied to the flow path 63. Therefore, the heated air existing between the housing 33 and the heating jacket 50 is quickly discharged to the outside of the heating jacket 50, promoting cooling of the housing 33.

Furthermore, the air supplied to the flow path 63 via the pipe 62 takes heat from the housing 33 when the air passes through the flow path 63 between the housing 33 and each of the part 40a to 40h, or the like. Thus, the housing 33 is rapidly cooled. Therefore, the waiting time until the start of the cleaning process can be shortened, thereby improving the throughput of the whole process.

Figure 7:
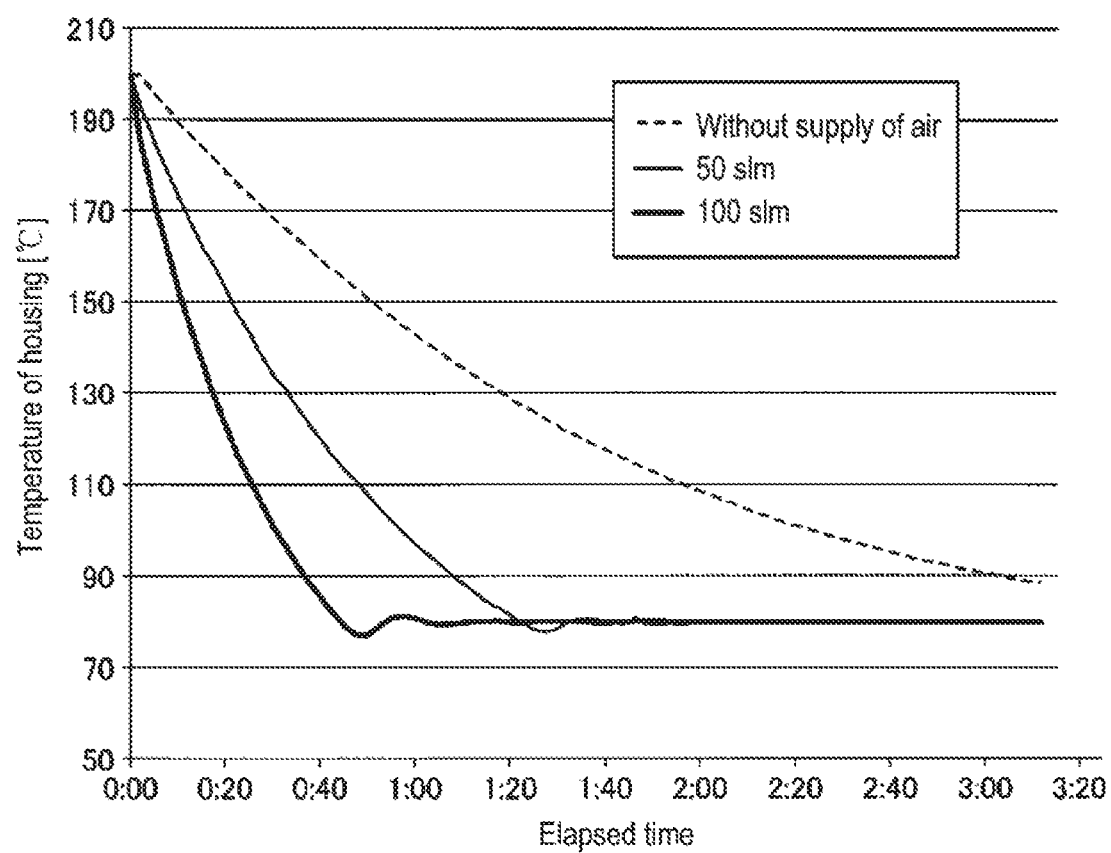
FIG. 7 is a diagram illustrating an example of a relationship between a supply amount of air and a temperature of a housing of the valve main body.

FIG. 7 is a diagram illustrating an example of a relationship between a supply amount of air and a temperature of the housing 33 of the valve main body 30. When air is not supplied to the flow path 63, for example, as illustrated in FIG. 7, it takes three hours or more for the temperature of the housing 33 heated to 200 degrees C. to reach 90 degrees C. or lower.

On the other hand, when air is supplied to the flow path 63 at 50 slm, for example, as illustrated in FIG. 7, the temperature of the housing 33 heated to 200 degrees C. has reached 90 degrees C. or lower in about 70 minutes. Since the control device 100 controls the heater in the heating jacket 50 such that the temperature of the housing 33 reaches 80 degrees C., the temperature of the housing 33 does not reach 80 degrees C. or lower in FIG. 7.

Furthermore, when air is supplied to the flow path 63 at 100 slm, for example, as illustrated in FIG. 7, the temperature of the housing 33 heated to 200 degrees C. has reached 90 degrees C. or lower in about 36 minutes. By further increasing the flow rate of the air supplied to the flow path 63, it is expected that the time until the temperature of the housing 33 falls from 200 degrees C. to 90 degrees C. or lower will be further shortened. As described above, the cooling time of the housing 33 can be controlled by controlling the flow rate of the air flowing through the flow path 63.

Moreover, in the present embodiment, among the members existing in the flow path through which the cleaning gas flows, the members other than the housing 33 are cooled to 90 degrees C. or lower in about 40 minutes. Therefore, even if only the housing 33 is cooled in less than 40 minutes, the cleaning process does not start until the other members are cooled to 90 degrees C. or lower. Accordingly, in some embodiments, the flow rate of the air supplied to the flow path 63 may be adjusted such that the time required for the temperature of the housing 33 to fall from 200 degrees C. to 90 degrees C. or lower is substantially equivalent to the time taken until the other members reach 90 degrees C. or lower. With this configuration, it is possible to suppress power consumption of the compressor 60.

[Film Forming Process]

Figure 8:
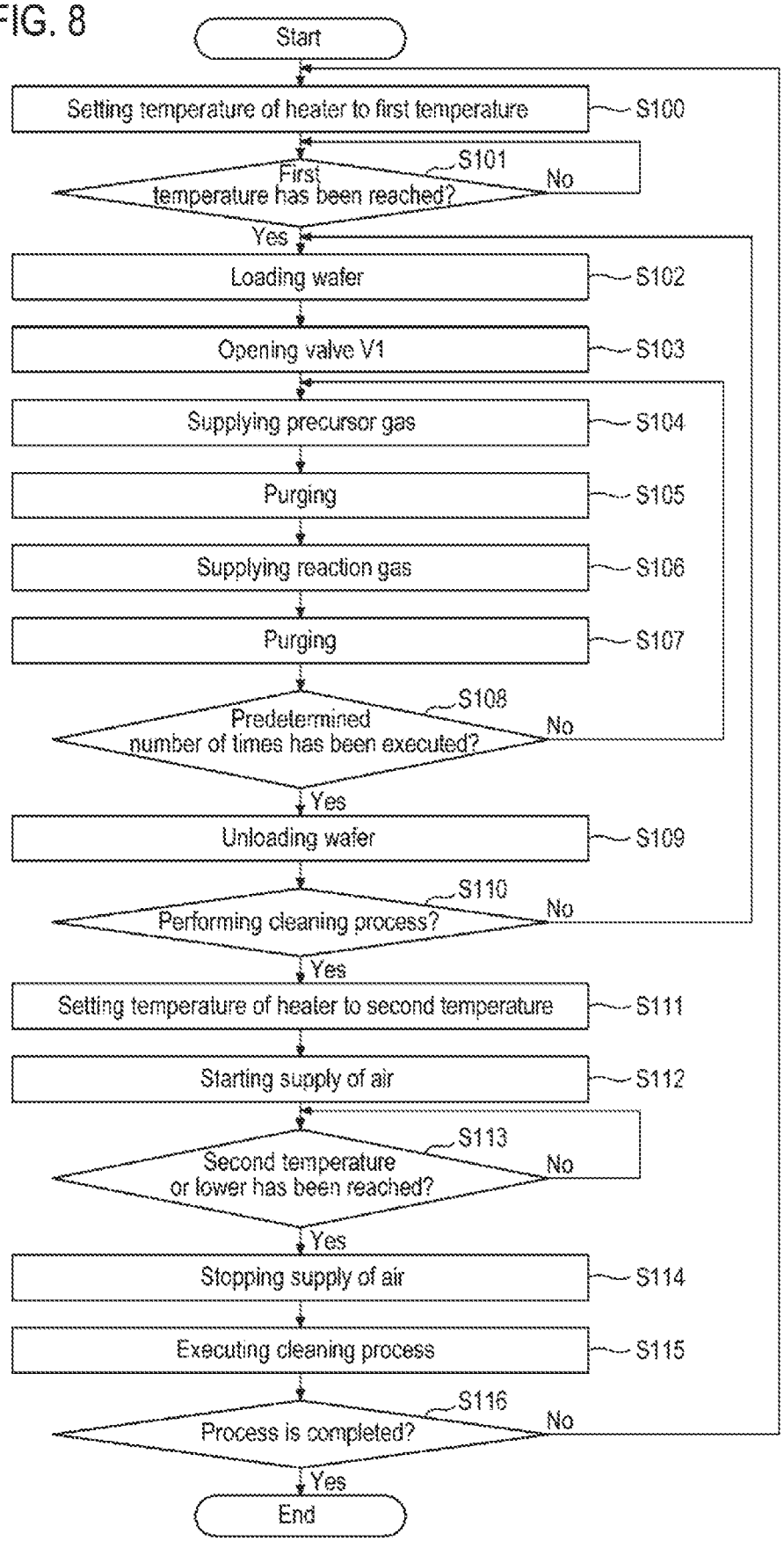
FIG. 8 is a flowchart illustrating an example of a film forming process.
Figure 9:
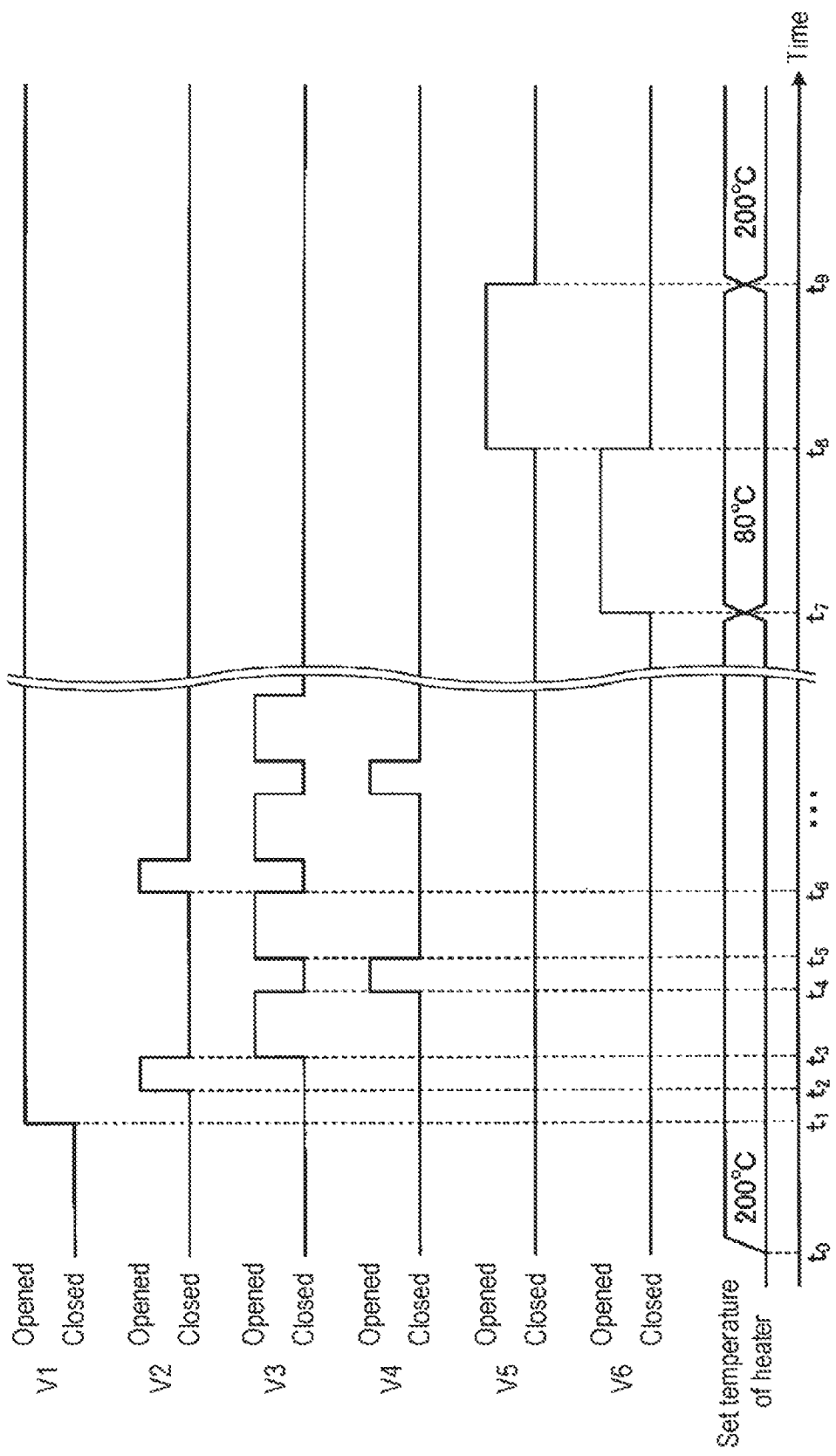
FIG. 9 is a timing chart illustrating an example of a state of each valve and a set temperature of a heater.

FIG. 8 is a flowchart illustrating an example of a film forming process. The process illustrated in the flowchart of FIG. 8 is performed by controlling the respective parts of the processing apparatus 10 by the control device 100. FIG. 9 is a timing chart illustrating an example of a state of each valve and a set temperature of the heater.

First, at time $t_0$ indicated in FIG. 9, for example, the control device 100 sets the temperature of the heater installed in each member forming the supply path of a $WCl_6$ gas which is a precursor gas to a first temperature (e.g., 200 degrees C.) (step S100). At step S100, the control device 100 also sets the temperature of the heater in the heating jacket 50 to the first temperature. Step S100 is an example of a heating process.

Next, the control device 100 determines whether or not the temperature of each member forming the supply path of the $WCl_6$ gas has reached the first temperature (step S101). When the temperature of each member forming the supply path of the $WCl_6$ gas has not reached the first temperature ("No" in step S101), the process of step S101 is again executed. The temperature sensor is installed in each member forming the supply path of the $WCl_6$ gas, and the control device 100 determines whether or not the temperature measured by the temperature sensor has reached the first temperature. For example, the control device 100 determines whether or not the temperature measured by the temperature sensor 34 installed in the housing 33 has reached the first temperature.

When the temperature of each member forming the supply path of the $WCl_6$ gas has reached the first temperature (e.g., time $t_1$ in FIG. 9) ("Yes" in step S101), the control device 100 opens the gate valve 18. Then, the control device 100 controls a transfer mechanism (not shown) to load a wafer W into the process vessel 11 through the opening 17 and mount the wafer W on the stage 12 (step S102). Then, the control device 100 withdraws the transfer mechanism from the process vessel 11 and closes the gate valve 18.

Next, the control device 100 operates the exhaust device 16 to exhaust the gas in the process vessel 11 to a desired degree of vacuum. Then, for example, at time $t_1$ indicated in FIG. 9, the control device 100 opens the valve V1 (step S103). Thus, an $N_2$ gas flows through the pipe 23a via the orifice 31 and flows through the pipe 23b via the orifice 32. Accordingly, the gas supplied to the process vessel 11 is suppressed from flowing backward to the pipe 23a or the pipe 23b.

Next, for example, at time $t_2$ indicated in FIG. 9, the control device 100 opens the valve V2 to supply the $WCl_6$ gas as the precursor gas into the process vessel 11 for a desired time (step S104). Thus, molecules of the precursor gas are adsorbed to the surface of the wafer W.

Next, for example, at time $t_3$ indicated in FIG. 9, the control device 100 closes the valve V2 to stop the supply of the precursor gas. Then, the control device 100 opens the valve V3 to supply the $N_2$ gas as an inert gas to the process vessel 11 for a desired time (step S105). Thus, molecules of the precursor gas excessively adsorbed to the surface of the wafer W are purged.

Next, for example, at time $t_4$ indicated illustrated in FIG. 9, the control device 100 closes the valve V3 to stop the supply of the inert gas for purging the surface of the wafer W. Then, the control device 100 opens the valve V4 to supply an $H_2$ gas as a reaction gas to the process vessel 11 for a desired time (step S106). Thus, the molecules of the precursor gas adsorbed to the surface of the wafer W react with molecules of the reaction gas to form a predetermined film (a tungsten film in the present embodiment) on the surface of the wafer W.

Next, for example, at time $t_5$ indicated illustrated in FIG. 9, the control device 100 closes the valve V4 to stop the supply of the reaction gas. Then, the control device 100 opens the valve V3 to supply the $N_2$ gas as the inert gas to the process vessel 11 for a desired time (step S107). Thus, molecules of the predetermined film formed excessively on the surface of the wafer W are purged.

Next, for example, at time $t_6$ indicated illustrated in FIG. 9, the control device 100 closes the valve V3 to stop the supply of the inert gas for purging the surface of the wafer W. Then, the control device 100 determines whether or not the process of steps S104 to S107 has been repeated a predetermined number of times (step S108). When the process of steps S104 to S107 has not been repeated the predetermined number of times ("No" in step S108), the process of step S104 is again executed.

On the other hand, when the process of steps S104 to S107 has been repeated the predetermined number of times ("Yes" in step S108), the control device 100 opens the gate valve 18 and controls the transfer mechanism (not shown) to unload the wafer W from the process vessel 11 (step S109).

Next, the control device 100 determines whether or not to execute the cleaning process (step S110). When the control device 100 determines not to perform the cleaning process ("No" in step S110), the control device 100 again executes the process of step S102. For example, when film formation of a predetermined number of wafers W is completed, the control device 100 determines to perform the cleaning process.

When that the control device 100 determines to perform the cleaning process ("Yes" in step S110), for example, at time $t_7$ indicated in FIG. 9, the control device 100 sets the temperature of the heater installed in each member in contact with a $ClF_3$ gas as a cleaning gas to a second temperature (e.g., 80 degrees C.) (step S111). At step S111, the control device 100 sets the temperature of the heater in the heating jacket 50 to the second temperature. Among the members in contact with the cleaning gas, members made of metal other than stainless steel, such as aluminum, are excluded from the management object of temperature.

Furthermore, at step S111, supply of power to the heater installed in each member in contact with the cleaning gas is stopped until the temperature of the corresponding member reaches the second temperature or lower. However, after the temperature of each member in contact with the cleaning gas reaches the second temperature or lower, power is supplied to the heater installed in each member so as to maintain the temperature of the corresponding member at the second temperature. Thus, when the film forming process is again performed after the cleaning process, a gas path that needs to be heated in the film forming process can be more quickly raised in temperature.

Next, the control device 100 starts supply of air of a desired flow rate to the flow path 63 installed between the housing 33 of the valve main body 30 and the heat diffusion jacket 40 (step S112). At step S112, the control device 100 opens the valve V6 and controls the flow rate controller 61 to supply the air of the desired flow rate to the flow path 63 via the pipe 62. Steps S111 and S112 are an example of a cooling process.

Next, the control device 100 determines whether or not the temperature of the member in contact with the cleaning gas has reached the second temperature or lower (step S113). When the temperature of the member in contact with the cleaning gas is higher than the second temperature ("No" in step S113), the process of step S113 is again executed. For example, the control device 100 determines whether or not the temperature measured by the temperature sensor 34 installed in the housing 33 has reached the second temperature or lower.

When the temperature of the member in contact with the cleaning gas has reached the second temperature or lower ("Yes" in step S113), for example, at time $t_8$ indicated in FIG. 9, the control device 100 closes the valve V6. Thus, the supply of air to the flow path 63 installed between the housing 33 of the valve main body 30 and the heat diffusion jacket 40 is stopped (step S114). Alternatively, the control device 100 may continue the supply of air to the flow path 63 even while the cleaning process is being performed.

Next, the control device 100 opens the valve V5 to supply the cleaning gas to the process vessel 11 such that the cleaning process is executed in the process vessel 11 (step S115).

Next, the control device 100 determines whether or not to complete the film formation process (step S116). For example, when film formation on a preset number of wafers W is completed, the control device 100 determines to compete the film forming process. When the control device 100 determines not to complete the film forming process ("No" in step S116), for example, at time $t_9$ indicated in FIG. 9, the control device 100 closes the valve V5 and again executes the process of step S100. On the other hand, when the control device 100 determines to complete the film forming process ("Yes" in step S116), the control device 100 closes the valve V1 and the valve V5, and completes the process indicated in this flowchart.

One embodiment of the processing apparatus 10 has been described above. The processing apparatus 10 according to the present embodiment includes the process vessel 11 in which the wafer W is accommodated, and the valve device 25 that controls the processing gas supplied to the process vessel 11. The valve device 25 includes the valves V1 to V5, the housing 33, the heat diffusion jacket 40, the heating jacket 50, the valve V6, and the control device 100. The valves V1 to V5 control the flow of the processing gases supplied to the process vessel 11. The housing 33 forms the flow paths through which the processing gases flow. The heat diffusion jacket 40 covers the housing 33 and diffuses the heat of the housing 33. The heating jacket 50 further covers the housing 33 covered with the heat diffusion jacket 40 and heats the housing 33 via the heat diffusion jacket 40. The valve V6 supplies the coolant to the flow path 63 formed between the housing 33 and the heat diffusion jacket 40. The control device 100 controls the heating jacket 50 so as to heat the housing 33 to the first temperature when a predetermined process is performed on the wafer W in the process vessel 11. Furthermore, the control device 100 stops the heating of the housing 33 by the heating jacket 50 before starting the cleaning process of the process vessel 11, and controls the valve V6 so as to supply the coolant to the flow path 63. Thus, it is possible to shorten the waiting time until the start of the cleaning process and to improve the throughput of the whole process.

Moreover, in the processing apparatus 10 of the present embodiment, the coolant supplied to the flow path 63 is air at room temperature. Thus, the housing 33 can be cooled at low cost.

Furthermore, in the present embodiment, in the cleaning process of the process vessel 11, the cleaning gas is supplied to the process vessel 11 via one of the flow paths in the housing 33, and the cleaning process of the process vessel 11 is performed after the temperature of the housing 33 has reached the second temperature or lower, which is lower than the first temperature. In the present embodiment, since the waiting time until the start of the cleaning process can be shortened, it is possible to improve the throughput of the whole process.

In addition, in the present embodiment, since the cleaning gas is a fluorine-containing gas such as a $ClF_3$ gas or the like, the supply of the cleaning gas starts after the temperature of the housing 33 to be brought into contact with the cleaning gas has reached the second temperature or lower so as to suppress the housing 33 from being corroded by the cleaning gas. However, in the present embodiment, the housing 33 is rapidly cooled by supplying the coolant to the flow path 63 formed between the housing 33 of the valve main body 30 and the heat diffusion jacket 40. Therefore, it is possible to shorten the waiting time until the start of the cleaning process and to improve the throughput of the whole process.

Furthermore, in the present embodiment, when the temperature of the housing 33 reaches the second temperature or lower, the control device 100 controls the heating jacket 50 so as to maintain the temperature of the housing 33 at the second temperature. Accordingly, when the film forming process is again performed after the cleaning process, it is possible to more quickly raise the temperature of the housing 33.

Moreover, in the present embodiment, when the temperature of the housing 33 reaches the second temperature or lower, the control device 100 controls the valve V6 so as to stop the supply of the coolant to the flow path 63. Thus, it is possible to reduce the consumption of the coolant.

[Others]

The technique disclosed in the present disclosure is not limited to the aforementioned embodiment, but various modifications may be made without departing the spirit of the present disclosure.

In one embodiment, in the aforementioned embodiment, WCl$_6$ is used as an example of the precursor used for forming a tungsten film, but the disclosed technique is not limited thereto and WCl$_5$ may be used as the precursor. Since WCl5$_5$ is also a solid at room temperature, the supply path of the precursor gas including the housing 33 of the valve main body 30 is heated to, e.g., 190 degrees C. so that the precursor can be maintained in a gaseous state.

Furthermore, in the aforementioned embodiment, although there has been described a case where a film deposited on the water W is a tungsten film as an example, the disclosed technique is not limited thereto and may be applied to a case where another film such as TiN or the like is deposited on the wafer W. For example, when depositing a TiN film on the wafer W, a TiCl$_4$ gas may be used as the precursor gas, and an NH$_3$ gas may be used as the reaction gas. Since TiCl$_4$ is a liquid at room temperature, the supply path of the precursor gas including the housing 33 of the valve main body 30 is heated to, e.g., 120 degrees C., so that the precursor can be maintained in a gaseous state.

In addition, in the aforementioned embodiment, the valve V3 is closed except when the film forming process is performed, but the disclosed technique is not limited thereto. For example, when the control device 100 determines to perform the cleaning process (e.g., at time t$_7$ indicated in FIG. 9), the valve V3 may be opened to supply the inert gas of a desired flow rate to the flow path in the housing 33 until the temperature of the housing 33 of the valve main body 30 reaches the second temperature or lower. That is to say, before starting the cleaning process of the process vessel 11, the control device 100 may control at least one of the valves V1 to V5 so that a gas having a temperature lower than the first temperature flows through each flow path in the housing 33. With this configuration, since the housing 33 is also cooled from the side of the gas flow path in the housing 33, it is possible to more quickly reduce the temperature of the housing 33.

Moreover, in the aforementioned embodiment, air in the clean room is used as the coolant, but the disclosed technique is not limited thereto. For example, dry air supplied to the clean room may be used as the coolant. Furthermore, when a coolant for cooling the wafer W flows through the flow path in the stage 12, the coolant may be allowed to flow through the flow path 63 between the housing 33 of the valve main body 30 and the heat diffusion jacket 40.

According to the present disclosure in some embodiments, it is possible to shorten a down time of a processing apparatus caused by a cleaning process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A valve device comprising:
   a plurality of valves configured to control a flow of a plurality of processing gases supplied to a process vessel;
   a housing in which a plurality of first flow paths through which the processing gases flow is formed;
   a heat diffuser configured to cover the housing and diffuse heat of the housing;
   a heat insulation configured to cover the housing covered with the heat diffuser, and a heater embedded in the heat insulation and being configured to heat the housing via the heat diffuser;
   a supply configured to supply a coolant to a second flow path formed between the housing and the heat diffuser; and
   a controller configured to:
      control the heater so as to heat the housing to a first temperature when a film forming process is performed on a target substrate in the process vessel; and
      after an end of the film forming process and before a start of a cleaning process of the process vessel, control the heater so as to stop heating of the housing, control the supply so as to supply the coolant to the second flow path, and control at least one of the valves such that a gas having a temperature lower than the first temperature flows through each of the first flow paths.

2. The valve device of claim 1, wherein the coolant is air at room temperature.

3. The valve device of claim 1, wherein in the cleaning process of the process vessel, a cleaning gas is supplied to the process vessel via one of the first flow paths, and
   wherein the cleaning process of the process vessel is performed after a temperature of the housing reaches a second temperature or lower, the second temperature being lower than the first temperature.

4. The valve device of claim 3, wherein the cleaning gas is a fluorine-containing gas.

5. The valve device of claim 4, wherein the cleaning gas is a CIF$_3$ gas.

6. The valve device of claim 3, wherein the controller is further configured to control the heater so as to maintain the temperature of the housing at the second temperature when the temperature of the housing reaches the second temperature or lower.

7. The valve device of claim 6, wherein the controller is further configured to control the supply so as to stop supply of the coolant to the second flow path when the temperature of the housing reaches the second temperature or lower.

8. A processing apparatus comprising:
   a process vessel in which a substrate as a processing target is accommodated; and
   a valve device configured to control a processing gas supplied to the process vessel,
   wherein the valve device comprises:
   a plurality of valves configured to control a flow of a plurality of processing gases supplied to the process vessel;
   a housing in which a plurality of first flow paths through which the processing gases flow is formed;
   a heat diffuser configured to cover the housing and diffuse heat of the housing;
   a heat insulation configured to cover the housing covered with the heat diffuser, and a heater embedded in the heat insulation and being configured to heat the housing via the heat diffuser;
   a supply configured to supply a coolant to a second flow path formed between the housing and the heat diffuser; and a controller configured to:
    control the heater so as to heat the housing to a first temperature when a film forming process is performed on the substrate accommodated in the process vessel; and
    after an end of the film forming process and before a start of a cleaning process of the process vessel, control the heater so as to stop heating of the housing, control the supply so as to supply the coolant to the second flow path, and control at least one of the valves such that a gas having a temperature lower than the first temperature flows through each of the first flow paths.

9. A method of controlling a processing apparatus, which comprises: a plurality of valves configured to control a flow of a plurality of processing gases supplied to a process vessel; a housing in which a plurality of first flow paths through which the processing gases flow is formed; a heat diffuser configured to cover the housing and diffuse heat of the housing; a heat insulation configured to cover the housing covered with the heat diffuser, and a heater embedded in the heat insulation and being configured to heat the housing via the heat diffuser; a supply configured to supply a coolant to a second flow path formed between the housing and the heat diffuser; and a controller, the method comprising:

heating the housing by controlling the heater so as to heat the housing to a first temperature when a film forming process is performed on a target substrate accommodated in the process vessel; and after an end of the film forming process and before a start of a cleaning process of the process vessel, cooling the housing by controlling the heater so as to stop the heating of the housing, by controlling the supply so as to supply the coolant to the second flow path, and by controlling at least one of the valves such that a gas having a temperature lower than the first temperature flows through each of the first flow paths.

* * * * *

UNITED STATES PATENT AND TRADEMARK OFFICE
CERTIFICATE OF CORRECTION

PATENT NO. : 11,306,847 B2
APPLICATION NO. : 16/538228
DATED : April 19, 2022
INVENTOR(S) : Tomohisa Kimoto et al.

It is certified that error appears in the above-identified patent and that said Letters Patent is hereby corrected as shown below:

On the Title Page

Item (72) Inventors: Please delete all Inventor city "Niraski (JP)" and replace with "Nirasaki (JP)".

Signed and Sealed this
Fourteenth Day of June, 2022

*Katherine Kelly Vidal*

Katherine Kelly Vidal
*Director of the United States Patent and Trademark Office*